(12) United States Patent
Harada et al.

(10) Patent No.: US 8,927,416 B2
(45) Date of Patent: Jan. 6, 2015

(54) SEMICONDUCTOR DEVICE AND METHOD OF MANUFACTURING THE SAME

(75) Inventors: Takeshi Harada, Toyama (JP); Junichi Shibata, Toyama (JP); Akira Ueki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 435 days.

(21) Appl. No.: 13/274,039

(22) Filed: Oct. 14, 2011

(65) Prior Publication Data
US 2012/0032333 A1 Feb. 9, 2012

Related U.S. Application Data

(63) Continuation of application No. PCT/JP2010/000444, filed on Jan. 27, 2010.

(30) Foreign Application Priority Data

Jun. 22, 2009 (JP) .................................. 2009-148054

(51) Int. Cl.
H01L 21/768 (2006.01)
H01L 23/22 (2006.01)
H01L 23/532 (2006.01)

(52) U.S. Cl.
CPC .... H01L 23/53238 (2013.01); H01L 21/76826 (2013.01); H01L 21/76834 (2013.01); H01L 21/76849 (2013.01); H01L 23/53295 (2013.01)
USPC ........... 438/637; 438/618; 438/622; 438/687; 257/762; 257/E21.545; 257/E21.577; 257/E23.141

(58) Field of Classification Search
CPC .................. H01L 21/76826; H01L 21/76834; H01L 23/03295; H01L 23/53238; H01L 21/76849
USPC .................. 438/618, 637, 687, 622; 257/762, 257/E21.545, E21.577, E23.141
See application file for complete search history.

(56) References Cited

U.S. PATENT DOCUMENTS

| | | | |
|---|---|---|---|
| 6,448,655 B1* | 9/2002 | Babich et al. ................. | 257/759 |
| 6,787,480 B2 | 9/2004 | Aoki et al. | |
| 7,910,897 B2* | 3/2011 | Schmitt .................... | 250/453.11 |
| 2002/0155702 A1 | 10/2002 | Aoki et al. | |
| 2003/0173671 A1* | 9/2003 | Hironaga et al. ............. | 257/758 |
| 2007/0018329 A1 | 1/2007 | Oh et al. | |
| 2009/0017621 A1* | 1/2009 | Sako et al. .................... | 438/674 |

FOREIGN PATENT DOCUMENTS

| | | |
|---|---|---|
| JP | 10-189604 | 7/1998 |
| JP | 2000-058544 | 2/2000 |
| JP | 2000-058544 A | 2/2000 |
| JP | 2002-246391 | 8/2002 |
| JP | 2004-096052 | 3/2004 |
| JP | 2007-027769 | 2/2007 |
| JP | 2009-016520 | 1/2009 |

* cited by examiner

*Primary Examiner* — Thinh T Nguyen
(74) *Attorney, Agent, or Firm* — McDermott Will & Emery LLP

(57) ABSTRACT

A first insulating film is formed on a semiconductor substrate, an interconnect groove is formed in the first insulating film, the inside of the interconnect groove is filled with a metal film, thereby forming a first interconnect. Then, a protective film is formed on the first insulating film and the first interconnect, and the surface of the protective film is exposed to reactive gas, thereby forming a reaction layer on an interface between the first interconnect and the protective film.

19 Claims, 12 Drawing Sheets

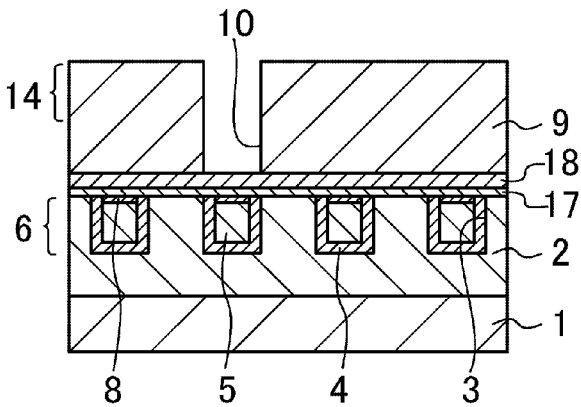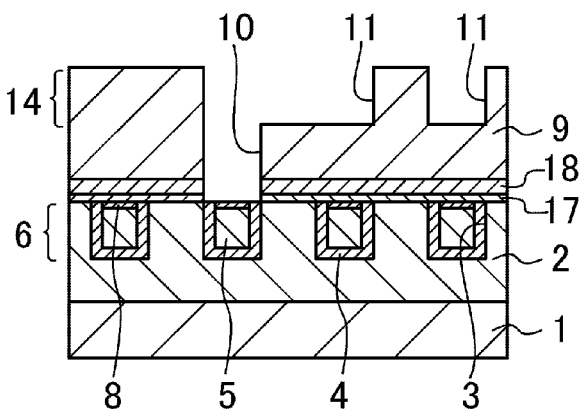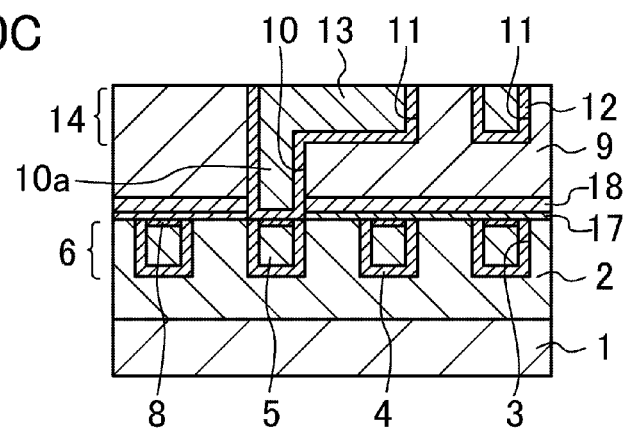

ND METHOD
SEMICONDUCTOR DEVICE AND METHOD OF MANUFACTURING THE SAME

CROSS-REFERENCE TO RELATED APPLICATION

This is a continuation of PCT International Application PCT/JP2010/000444 filed on Jan. 27, 2010, which claims priority to Japanese Patent Application No. 2009-148054 filed on Jun. 22, 2009. The disclosures of these applications including the specifications, the drawings, and the claims are hereby incorporated by reference in their entirety.

BACKGROUND

The present disclosure relates to semiconductor devices, and methods of manufacturing such semiconductor devices, and more particularly to semiconductor devices having a buried interconnect structure and methods of manufacturing such semiconductor devices.

In recent years, with miniaturization of semiconductor integrated circuit devices, a current flowing through interconnects in the devices increases, and as a result, failure due to electromigration has become a serious problem.

In order to prevent electromigration, it is necessary to improve adhesion between interconnects and films in the vicinity of the interconnects. Japanese Patent Publication No. H10-189604 and the like disclose a method of improving adhesion between interconnects and films in the vicinity of the interconnects by exposing a surface of an interconnect made of copper (Cu) to a silicon compound, such as silane ($SiH_4$), etc., to form a copper silicide ($CuSi_x$) layer.

FIGS. 11A-11D and FIGS. 12A-12C show a method of manufacturing a conventional semiconductor device for improving adhesion between interconnects and films in the vicinity of the interconnects in the order of the steps performed.

First, as shown in FIG. 11A, a first insulating film 102 is formed on a semiconductor substrate 101, and a first interconnect groove 103 is formed in the upper part of the first insulating film 102 by use of a lithography method and a dry etching method.

Next, as shown in FIG. 11B, a first barrier film 104 and a first copper (Cu) film 105 are sequentially formed on the first insulating film 102, and sidewalls and the bottom surface of the first interconnect groove 103, thereby filling the first interconnect groove 103. Then, the first barrier film 104 and the first Cu film 105 formed outside the first interconnect groove 103 are removed by a chemical mechanical polishing (CMP) method to form a lower interconnect 106.

Next, as shown in FIG. 11C, the semiconductor substrate 101 is heated, and is exposed to a silicon compound, such as silane ($SiH_4$), etc., to form a copper silicide ($CuSi_x$) layer 107 serving as a reaction layer in the upper part of the first Cu film 105.

Next, as shown in FIG. 11D, a portion located on the semiconductor substrate 101 is exposed to plasma of a nitrogen compound, such as ammonia ($NH_3$), etc., to nitride the upper part of the $CuSi_x$ layer 107, thereby forming a silicon nitride (SiN) layer 108.

Next, as shown in FIG. 12A, a second insulating film 109 is formed so as to cover the first insulating film 102, the first barrier film 104, and the SiN film 108, and a via hole 110 through which the lower interconnect 106 is exposed is formed in the second insulating film 109 by a lithography method and a dry etching method.

Next, as shown in FIG. 12B, a second interconnect groove 111 is formed in the upper part of the second insulating film 109. Part of the second interconnect groove 111 includes the via hole 110 through which the lower interconnect 106 is exposed.

Next, as shown in FIG. 12C, a second barrier film 112 and a second Cu film 113 are sequentially formed on the second insulating film 109, sidewalls and the bottom surface of the via hole 110, and sidewalls and the bottom surface of the second interconnect groove 111, thereby filling the via hole 110 and the second interconnect groove 111. Then, the second barrier film 112 and the second Cu film 113 formed outside the via hole 110 and the second interconnect groove 111 are removed by the CMP method to form an upper interconnect 114, thereby achieving a semiconductor device including two layers of interconnects. Then, by repeating the steps shown in FIGS. 11C-12C, a semiconductor device including a desired number of layers of interconnects can be manufactured.

With such steps, a semiconductor device in which the $CuSi_x$ layer 107 is interposed between the first Cu film 105 and the SiN film 108 can be obtained, and the $CuSi_x$ layer 107 improves adhesion between the first Cu film 105 and the SiN film 108.

SUMMARY

However, the method of manufacturing the conventional semiconductor device has the following problems.

In the method of manufacturing the conventional semiconductor device, when a $CuSi_x$ layer serving as a reaction layer is formed, the reaction between a Cu film and $SiH_4$ further proceeds than expected due to variation of surface temperatures and crystal conditions of the Cu film, and a $CuSi_x$ layer having a thickness larger than an expected thickness may be formed. As a result, a resistance of the interconnect increases, and the operating speed of the semiconductor device is reduced. In particular, in a miniaturized semiconductor device having the minimum line width of 100 nm or less, the reduction of the operating speed due to the increase of the resistance of the interconnect causes a serious problem.

In order to avoid the above problem, a temperature of heating the semiconductor substrate may be set to be lower. However, in this method, the $CuSi_x$ layer formed by the reaction between the Cu film and $SiH_4$ has a small thickness, and therefore, adhesion between the Cu film and films in the vicinity of the Cu film is reduced, and electromigration resistance is deteriorated.

In view of the above problems, it is an object of the present invention to achieve a semiconductor device having electromigration resistance that is high enough for practical use and an operating speed that is high enough for practical use.

In order to achieve the object, the present invention is directed to a method of manufacturing semiconductor devices, the method including a step of forming a reaction layer on an interface between an interconnect and a protective film.

Specifically, a first method of manufacturing a semiconductor device according to the present invention includes the steps of: (a) forming a first insulating film on a semiconductor substrate; (b) forming an interconnect groove in the first insulating film; (c) forming a first interconnect in the interconnect groove; (d) forming a protective film on the first insulating film and the first interconnect; and after the step (d), (e) exposing a surface of the protective film to reactive gas, thereby forming a reaction layer on an interface between the first interconnect and the protective film.

In the first method of manufacturing the semiconductor device according to the present invention, the thickness of the reaction layer can be precisely controlled, and therefore, semiconductor devices having electromigration resistance that is high enough for practical use and an operating speed that is high enough for practical use can be obtained.

In the first method of manufacturing the semiconductor device according to the present invention, it is preferable that the step (e) is performed by exposing the surface of the protective film to a silicon compound or a germanium compound.

In the first method of manufacturing the semiconductor device according to the present invention, it is preferable that the step (e) includes a sub-step of chemically activating the reactive gas.

In the first method of manufacturing the semiconductor device according to the present invention, it is preferable that the step (e) includes a sub-step of chemically activating the reactive gas by ionizing the reactive gas.

In the first method of manufacturing the semiconductor device according to the present invention, it is preferable that the step (e) includes a sub-step of physically activating the reactive gas.

In the first method of manufacturing the semiconductor device according to the present invention, it is preferable that the step (e) includes a sub-step of physically activating the reactive gas by imparting kinetic energy to the reactive gas.

The first method of manufacturing the semiconductor device according to the present invention may further include: (f) forming a second insulating film on the protective film; (g) forming a via hole inside the second insulating film; and (h) filling the via hole with a metal material to form a via, and forming a second interconnect so that the second interconnect is connected to the via.

In the first method of manufacturing the semiconductor device according to the present invention, it is preferable that the protective film is a silicon carbonitride film.

It is preferable that the first method of manufacturing the semiconductor device according to the present invention further includes the step of (c1) forming a cover layer in the upper part of the first interconnect after the step (c) and before the step (d).

In this case, it is preferable that a main material of the cover layer is nickel, nickel alloy, cobalt, or cobalt alloy.

The first method of manufacturing the semiconductor device according to the present invention may further include the step of (e1) exposing the surface of the protective film to plasma after the step (e).

In this case, it is preferable that the plasma is generated in an atmosphere including a nitrogen compound.

It is preferable that the first method of manufacturing the semiconductor device according to the present invention further includes the step of (e2) exposing the surface of the protective film to ultraviolet radiation after the step (e).

It is preferable that the first method of manufacturing the semiconductor device according to the present invention further includes the step of (e3) forming a stopper film on the protective film after the step (e).

In this case, it is preferable that the stopper film is an oxygen doped silicon carbide film or a silicon nitride film.

In the first method of manufacturing the semiconductor device according to the present invention, it is preferable that the reaction layer is a silicon compound layer or a germanium compound layer.

In the first method of manufacturing the semiconductor device according to the present invention, it is preferable that a main material of the first interconnect is aluminum, aluminum alloy, copper, copper alloy, silver, silver alloy, gold, or gold alloy.

A second method of manufacturing a semiconductor device according to the present invention includes the steps of: forming a first insulating film on a semiconductor substrate; forming an interconnect groove in the first insulating film; forming a first interconnect in the interconnect groove; and forming a reaction layer in an upper part of the first interconnect, wherein the reaction layer is formed under a condition where a supply rate controls a reaction.

In the second method of manufacturing the semiconductor device regarding the present invention, the reaction layer is formed under the condition where a supply rate controls the reaction, thereby making it possible to precisely control the thickness of the reaction layer, and therefore, semiconductor devices having electromigration resistance that is high enough for practical use and an operating speed that is high enough for practical use can be obtained.

In the second method of manufacturing the semiconductor device according to the present invention, it is preferable that the reaction layer is a silicon compound layer or a germanium compound layer.

A semiconductor device according to the present invention includes: a first insulating film formed on a semiconductor substrate; a first interconnect formed in the first insulating film; a protective film formed on the first insulating film and the first interconnect; and a germanium compound layer formed on an interface between the first interconnect and the protective film.

In the semiconductor device according to the present invention, the thickness of the germanium compound layer can be precisely controlled, and therefore, the semiconductor device exhibits electromigration resistance that is high enough for practical use and has an operating speed that is high enough for practical use.

The semiconductor device according to the present invention may further include: a second insulating film formed on the protective film; a via formed on the first interconnect to pass through the protective film and the second insulating film; and a second interconnect formed to be connected to the via.

It is preferable that the semiconductor device according to the present invention further includes: a stopper film formed on the protective film; a second insulating film formed on the stopper film; a via formed on the first interconnect to pass through the protective film, the stopper film, and the second insulating film; and a second interconnect formed to be connected to the via.

In the semiconductor device according to the present invention, it is preferable that the protective film is a silicon carbonitride film.

In the semiconductor device according to the present invention, it is preferable that the stopper film is an oxygen doped silicon carbide film or a silicon nitride film.

In the semiconductor device according to the present invention, it is preferable that the germanium compound layer includes nickel or cobalt.

In the semiconductor device according to the present invention, it is preferable that a main material of the first interconnect is aluminum, aluminum alloy, copper, copper alloy, silver, silver alloy, gold, or gold alloy.

In view of the foregoing, in the semiconductor device and the method of manufacturing the same according to the present invention, it is possible to precisely control a thickness of the reaction layer, and therefore, semiconductor devices having electromigration resistance that is high enough for practical use and an operating speed that is high enough for practical use can be provided.

BRIEF DESCRIPTION OF THE DRAWINGS

FIGS. 10A-10C are cross-sectional views illustrating the method of manufacturing the semiconductor device according to the second example embodiment in the order of the steps performed.

DETAILED DESCRIPTION (First Example Embodiment)

A semiconductor device according to a first example embodiment will be described with reference to FIG. 1.

Respective figures, and shapes, materials, and size, etc. of various elements indicated below are preferable examples, and thus, the invention is not limited to those disclosed. The embodiments may be modified as appropriate without being limited to those disclosed, without departing the spirit and scope of the invention.

Figure 1:
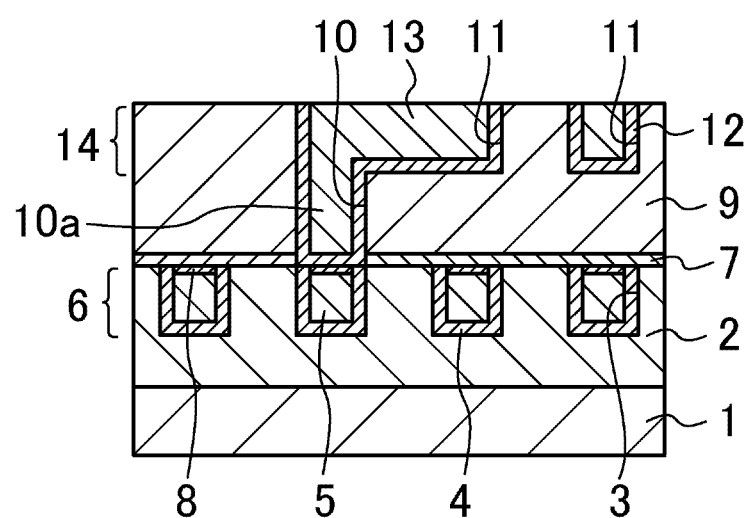
FIG. 1 is a cross-sectional view of a semiconductor device according to a first example embodiment.

As shown in FIG. 1, a first insulating film 2 which is a carbon doped silicon oxide film (SiOC film) is formed on a semiconductor substrate 1, and a first interconnect groove 3 is formed in the upper part of the first insulating film 2. A first barrier film 4 is formed on side walls and the bottom surface of the first interconnect groove 3, and a first copper (Cu) film 5 is formed on the first barrier film 4 so as to fill the first interconnect groove 3 to from a lower interconnect 6. A copper silicide ($CuSi_x$) layer 8 is formed on the first Cu film 5 serving as a reaction layer, and a protective film 7 which is a silicon carbonitride film (SiCN film) having a thickness of approximately 10 nm is formed so as to cover the first insulating film 2, the first barrier film 4, and the $CuSi_x$ layer 8. A second insulating film 9 which is a SiOC film is formed on the protective film 7. A via hole 10 which passes through the second insulating film 9 and the protective film 7, and through which the lower interconnect 6 is exposed is formed on part of the $CuSi_x$ layer 8 and on the first barrier film 4 formed in the vicinity of the $CuSi_x$ layer 8, and a second interconnect groove 11 is formed in the upper part of the second insulating film 9. Part of the second interconnect groove 11 includes the via hole 10 through which the lower interconnect 6 is exposed. A second barrier film 12 is formed on the via hole 10, and sidewalls and the bottom surface of the second interconnect groove 11, and a second Cu film 13 is formed on the second barrier film 12 so as to fill the via hole 10 and the second interconnect groove 11, thereby forming a via 10a and an upper interconnect 14. The via 10a connects the lower interconnect 6 and the upper interconnect 14 together.

The semiconductor device according to the first example embodiment is provided with a reaction layer having a thickness necessary to reduce the increase of the resistance of the interconnect, and improve adhesion between the interconnect and films in the vicinity of the interconnect, and therefore, the semiconductor device can have electromigration resistance that is high enough for practical use, and an operating speed that is high enough for practical use.

Next, a method of manufacturing the semiconductor device according to the first example embodiment will be described with reference to FIGS. 2A-2D, and FIGS. 3A-3C.

Figure 2A:
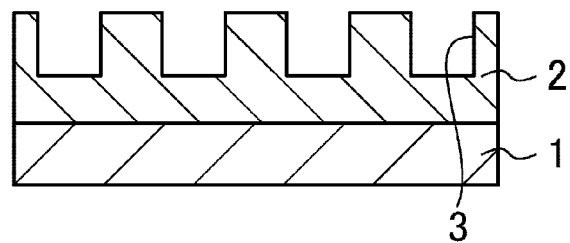
FIGS. 2A-2D are cross-sectional views illustrating a method of manufacturing the semiconductor device according to the first example embodiment in the order of the steps performed.

First, as shown in FIG. 2A, the first insulating film 2 which is a SiOC film is formed on the semiconductor substrate 1, and the first interconnect groove 3 is formed in the upper part of the first insulating film 2 by a lithography method and a dry etching method.

Figure 2B:
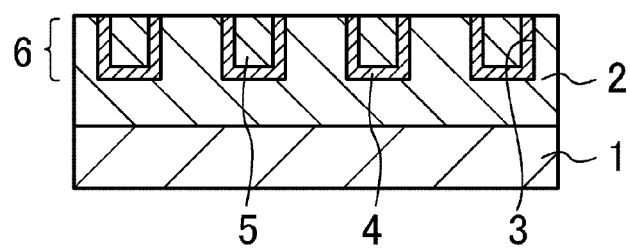

Next, as shown in FIG. 2B, the first barrier film 4 and the first Cu film 5 are sequentially formed on the first insulating film 2, and sidewalls and the bottom surface of the first interconnect groove 3, thereby filling the first interconnect groove 3. Then, the first barrier film 4 and the first Cu film 5 formed outside the first interconnect groove 3 are removed by a chemical mechanical polishing (CMP) method to form the lower interconnect 6. In this embodiment, the lower interconnect 6 is set to have the minimum line width of approximately 60 nm, and a height of approximately 100 nm.

Figure 2C:
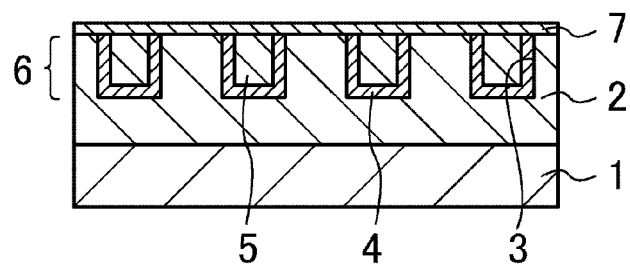

Next, as shown in FIG. 2C, the protective film 7 which is a SiCN film having a thickness of approximately 10 nm is formed so as to cover the first insulating film 2, the first barrier film 4, and the first Cu film 5.

Figure 2D:
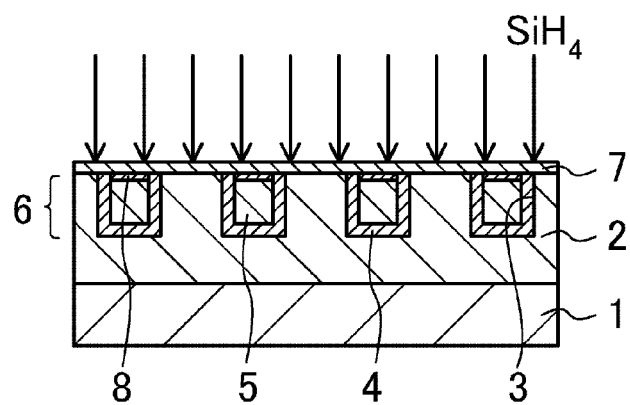

Next, as shown in FIG. 2D, the semiconductor substrate 1 is heated so as to have a temperature of about 400° C., and is exposed to $SiH_4$. With this step, the $CuSi_x$ layer 8 serving as a reaction layer is formed on an interface between the first Cu film 5 and the protective film 7. That is because $SiH_4$ is diffused into the inside of the protective film 7 to reach the surface of the first Cu film 5 and to react to the first Cu film 5. In this way, since the $CuSi_x$ layer 8 is formed, the thickness of the $CuSi_x$ layer 8 can be precisely controlled compared to the conventional art. A detail reason of this will be subsequently described.

Figure 3A:
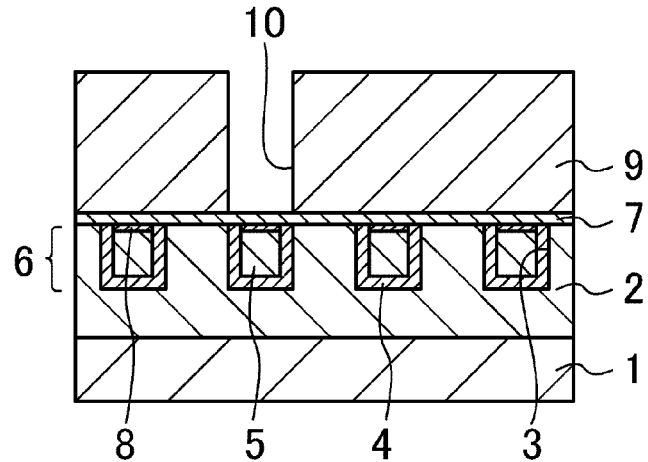
FIGS. 3A-3C are cross-sectional views illustrating the method of manufacturing the semiconductor device according to the first example embodiment in the order of the steps performed.

Next, as shown in FIG. 3A, the second insulating film 9 which is a SiOC film is formed on the protective film 7, and the via hole 10 through which the protective film 7 is exposed is formed in the second insulating film 9 by a lithography method and a dry etching method.

Figure 3B:
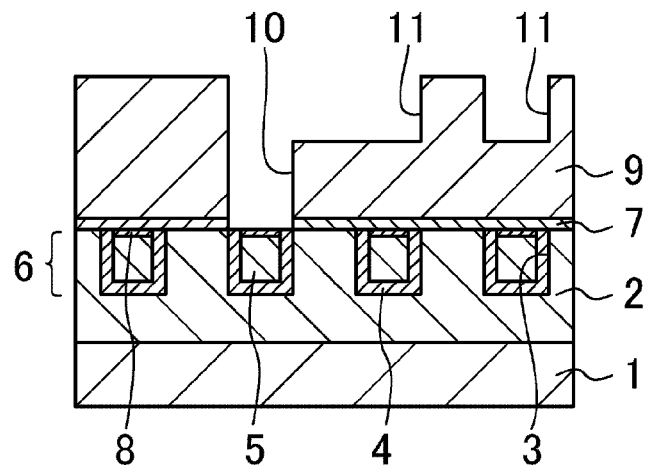

Next, as shown in FIG. 3B, the second interconnect groove 11 is formed in the upper part of the second insulating film 9 by the lithography method and the dry etching method, and part of the protective film 7 located on the bottom surface of the via hole 10 is removed to expose the first barrier film 4 and the CuSi$_x$ layer 8. Part of the second interconnect groove 11 includes the via hole 10 through which the lower interconnect 6 is exposed.

Figure 3C:
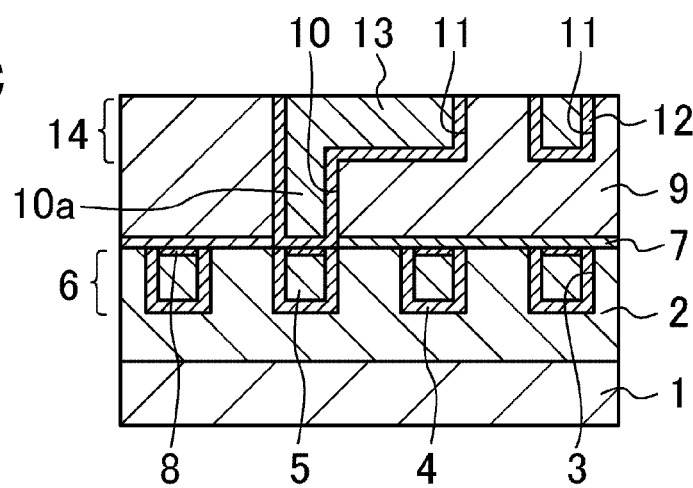

Next, as shown in FIG. 3C, the second barrier film 12 and the second Cu film 13 are sequentially formed on the second insulating film 9, sidewalls and the bottom surface of the via hole 10, and sidewalls and the bottom surface of the second interconnect groove 11, thereby filling the via hole 10 and the second interconnect groove 11. Then, the second barrier film 12 and the second Cu film 13 formed outside the via hole 10 and the second interconnect groove 11 are removed by the CMP method to form a via 10a and the upper interconnect 14, thereby achieving a semiconductor device including two layers of interconnects. In this embodiment, the upper interconnect 14 is set to have the minimum line width of approximately 60 nm, and the minimum height of approximately 100 nm. After the step shown in FIG. 3B, by repeating the steps shown in FIGS. 2C-3C, a semiconductor device including a desired number of layers of interconnects can be manufactured.

In the method of manufacturing the semiconductor device according to the first example embodiment, the CuSi$_x$ layer serving as a reaction layer can be precisely controlled, and therefore, semiconductor devices having electromigration resistance that is high enough for practical use and an operating speed that is high enough for practical use can be obtained.

The reason why the thickness of the CuSi$_x$ layer 8 can be precisely controlled in this embodiment compared to the prior art will be described. In general, it has been known that SiH$_4$ decomposes on the surface of a Cu film by a catalytic action, whereby a CuSi$_x$ layer is formed. At a low temperature of 300° C. or less, this reaction is limited or controlled by a reaction rate, and therefore, the thickness of the CuSi$_x$ layer to be formed is greatly influenced by the surface temperature and the crystal condition of the Cu film. By contrast, in this embodiment, the protective film 7 is formed on the first Cu film 5, thereby diffusing SiH$_4$ into the inside of the protective film 7 to supply the SiH$_4$ to the surface of the first Cu film 5, and therefore, the reaction is limited or controlled by a supply rate of SiH$_4$. In other words, the thickness of the CuSi$_x$ layer 8 is determined based on the amount of SiH$_4$ which reaches the surface of the first Cu film 5, and therefore, the reaction is not influenced by the surface temperature and the crystal condition of the first Cu film 5. For the above reason, the thickness of the CuSi$_x$ layer 8 can be precisely controlled in this embodiment, compared to the prior art.

In order to allow the reaction for forming the CuSi$_x$ layer 8 to be limited or controlled by the supply rate, in addition to the above method, there is another method of setting the heating temperature of the semiconductor substrate 1 to be high, e.g., about 350° C., and setting the partial pressure of SiH$_4$ to be low, e.g., about 1 mPa to allow the first Cu film 5 to directly come into contact with SiH$_4$, without forming the protective film 7. However, in this method, the growth rate of the CuSi$_x$ layer 8 is higher, and it is difficult to form the CuSi$_x$ layer 8 having a thickness of several nm which is necessary to manufacture a semiconductor device with good controllability, and therefore, it is preferable to supply SiH$_4$ through the protective film 7.

As stated above, the role of the protective film 7 is to properly control the amount of SiH$_4$ which reaches the surface of the first Cu film 5, and therefore, the protective film 7 has to have fine pores through which SiH$_4$ can pass. The protective film 7 is chemically inert toward the first insulating film 2, the first Cu film 5, and the second insulating film 9, and has to have proper adhesion. Example materials satisfying the above conditions include SiCN containing a CH$_3$ group as an impurity. The protective film 7 made of such SiCN can be obtained by a Plasma Chemical Vapor Deposition (CVD) method using tetramethylsilane (TMS) and ammonia (NH$_3$) as source gas. When the thickness of the protective film 7 is less than 2.5 nm, abnormal growth of the CuSi$_x$ layer 8 due to pin holes increases. On the contrary, when the thickness of the protective film 7 is more than 20 nm, the amount of SiH$_4$ which reaches the surface of the first Cu film 5 extremely decreases, and the growth rate of the CuSi$_x$ layer 8 extremely decreases. Therefore, it is preferable that the protective film 7 is set to have a thickness of 2.5 nm or more and 20 nm or less. In this embodiment, a SiCN film having a thickness of approximately 10 nm as the protective film 7 is used.

Next, a preferable heating temperature of the semiconductor substrate 1 in the step shown in FIG. 2D will be described. When the heating temperature is set to be less than 300° C., the speed of SiH$_4$ at which SiH$_4$ is diffused into the inside of the protective film 7 decreases, and the CuSi$_x$ layer 8 having an enough thickness cannot be obtained. When the heating temperature is set to be more than 400° C., a Si layer is formed on the surface of the protective film 7 due to decomposition reaction of SiH$_4$. Therefore, it is preferable that the heating temperature is set to be approximately 300° C. or more and approximately 400° C. or less, and in this embodiment, the heating temperature is set to be approximately 400° C.

Next, a preferable thickness of the CuSi$_x$ layer 8 in the step shown in FIG. 2D will be described. When the thickness of the CuSi$_x$ layer 8 is less than 2 nm, it becomes difficult to maintain integrity of the CuSi$_x$ layer 8, e.g., to prevent the CuSi$_x$ layer 8 from being damaged or avoid layer defects, and adhesion between the first Cu film 5 and the protective film 7 is reduced. When the thickness of the CuSi$_x$ layer 8 is more than 10 nm, the resistance of the lower interconnect 6 increases, and the operating speed of the semiconductor device decreases. Therefore, it is preferable that the thickness of the CuSi$_x$ layer 8 is set to be approximately 2 nm or more and approximately 10 nm or less.

(First Modified Example of First Example Embodiment)

A semiconductor device according to a first modified example of the first example embodiment will be described hereinafter with reference to FIG. 4. In the semiconductor device in the first modified example of the first example embodiment, the same reference characters as those shown in FIG. 1 in the semiconductor device of the first example embodiment have been used to designate elements identical with the elements shown in FIG. 1 in the semiconductor device of the first example embodiment, and explanation thereof will be omitted. Elements different from those in the first example embodiment will be described.

Figure 4:
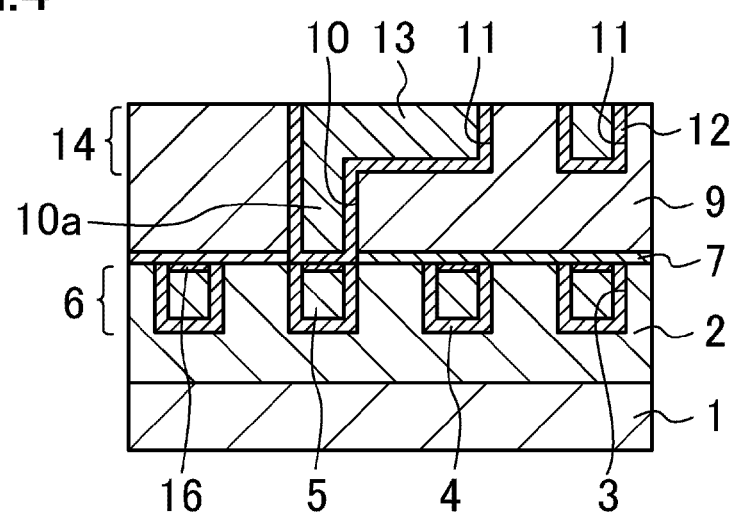
FIG. 4 is a cross-sectional view of a semiconductor device according to a first modified example of the first example embodiment.

As shown in FIG. 4, the semiconductor device in the first modified example is different from the semiconductor device in the first example embodiment in that a reaction layer 16 is formed on the first Cu film 5, and the protective film 7 is formed on the reaction layer 16 in the first modified example. The reaction layer 16 is made of a mixture of CuSi$_x$ and NiSi$_x$. In this way, the formation of the reaction layer 16 further improves the adhesion between the first Cu film 5 and the protective film 7 compared to the first example embodiment, and therefore, electromigration resistance can be further improved.

The semiconductor device according to the first modified example of the first example embodiment is provided with a reaction layer having a thickness necessary to reduce an increase of the resistance of the interconnect, and improve adhesion between the interconnect and films in the vicinity of the interconnect, and therefore, the semiconductor device can have electromigration resistance that is high enough for practical use and an operating speed that is high enough for practical use.

A method of manufacturing the semiconductor device according to the first modified example of the first example embodiment will be described hereinafter with reference to FIGS. 5A-5C, and FIGS. 6A-6C. In FIGS. 5A-5C, and FIGS. 6A-6C, the same reference characters as those shown in FIGS. 2A-2D and FIGS. 3A-3C in the first example embodiment have been used to designate elements identical with the elements shown in FIGS. 2A-2D and FIGS. 3A-3C in the first example embodiment, and explanation thereof will be omitted. In the first modified example of the first example embodiment, the steps of forming the semiconductor substrate 1 through the lower interconnect 6 are identical with those shown in the first example embodiment, and explanation thereof will be omitted.

Figure 5A:
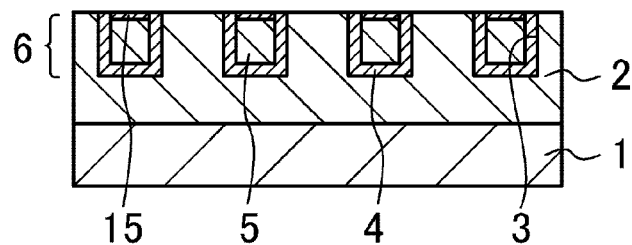
FIGS. 5A-5C are cross-sectional views illustrating a method of manufacturing the semiconductor device according to the first modified example of the first example embodiment in the order of the steps performed.

First, as shown in FIG. 5A, a cover layer 15 is formed in the upper part of the first Cu film 5. The cover layer 15 has to be able to be selectively formed on the surface of the first Cu film 5, and to generate a stable compound by reacting to $SiH_4$. As a material which satisfies these conditions, a nickel (Ni) film, a Ni alloy film, a cobalt (Co) film, and a Co alloy film, etc. have been known. These films can be selectively formed on the surface of the first Cu film 5 by an electroless plating method. In this embodiment, the cover layer 15 is a Ni layer precipitated by the electroless plating method.

Figure 5B:
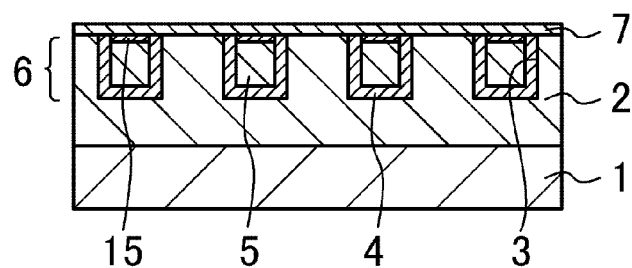

Next, as shown in FIG. 5B, the protective film 7 is formed so as to cover the first insulating film 2, the first barrier film 4, and the cover layer 15.

Figure 5C:
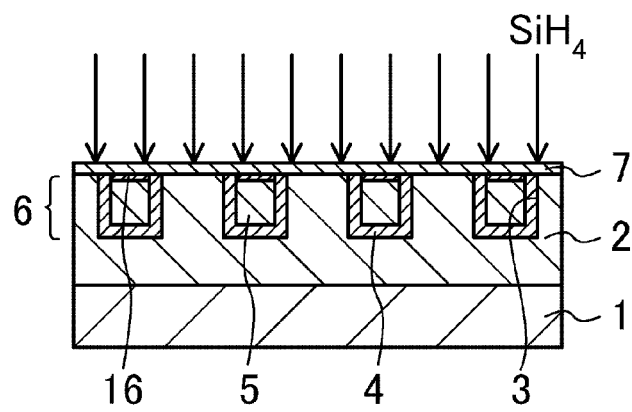

Next, as shown in FIG. 5C, the semiconductor substrate 1 is heated to be exposed to $SiH_4$. This forms the reaction layer 16 on an interface between the first Cu film 5 and the protective film 7. In this embodiment, the reaction layer 16 is made of a mixture of $CuSi_x$ and $NiSi_x$. In this way, the formation of the reaction layer 16 further improves the adhesion between the first Cu film 5 and the protective film 7 compared to the first example embodiment, and therefore, electromigration resistance can be further improved.

Figure 6A:
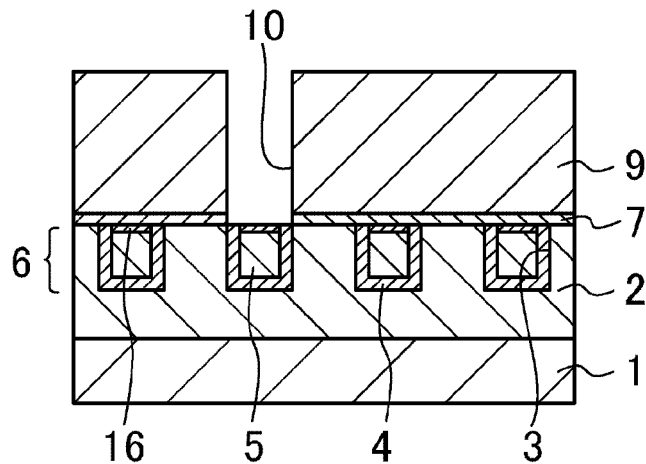
FIGS. 6A-6C are cross-sectional views illustrating the method of manufacturing the semiconductor device according to the first modified example of the first example embodiment in the order of the steps performed.
Figure 6B:
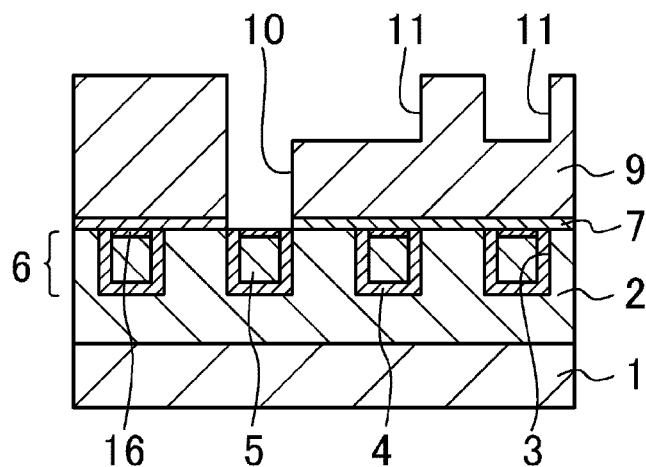
Figure 6C:
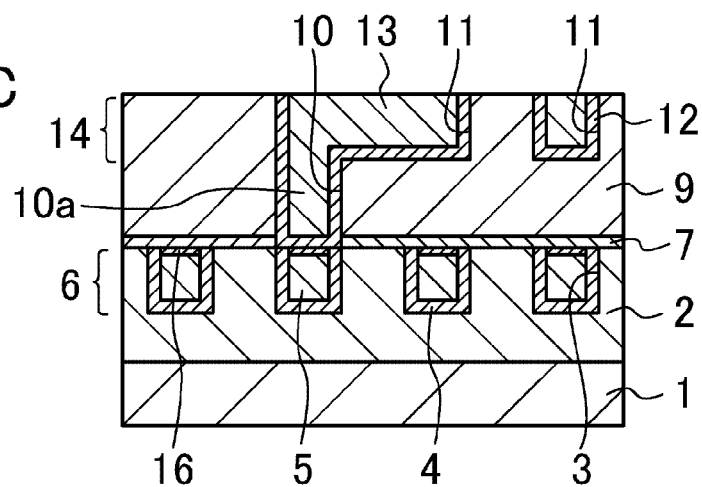

Next, as shown in FIGS. 6A-6C, as well as in the first example embodiment, after the second insulating film 9 is formed on the protective film 7, and the via hole 10 and the second interconnect groove 11 are formed in the second insulating film 9, the second barrier film 12 and the second Cu film 13 are sequentially formed so as to fill the via hole 10 and the second interconnect groove 11, thereby forming a via 10a and the upper interconnect 14. After the step shown in FIG. 6C, by repeating the steps shown in FIGS. 5B-6C, a semiconductor device including a desired number of layers of interconnects can be manufactured.

According to the first modified example of the first example embodiment, the thickness of the layer serving as a reaction layer and made of the mixture of $CuSi_x$ and $NiSi_x$ can be precisely controlled, and therefore, semiconductor devices having electromigration resistance that is high enough for practical use and an operating speed that is high enough for practical use can be obtained.

(Second Modified Example of First Example Embodiment)

A second modified example of the first example embodiment will be described hereinafter with reference to FIGS. 7A-7D. In FIGS. 7A-7D, the same reference characters as those shown in FIGS. 2A-2D and FIGS. 3A-3C in the first example embodiment have been used to designate elements identical with the elements shown in FIGS. 2A-2D and FIGS. 3A-3C in the first example embodiment, and explanation thereof will be omitted. In the second modified example of the first example embodiment, the steps of forming the semiconductor substrate 1 through the $CuSi_x$ layer 8 are identical with those shown in the first example embodiment, and explanation thereof will be omitted.

Figure 7A:
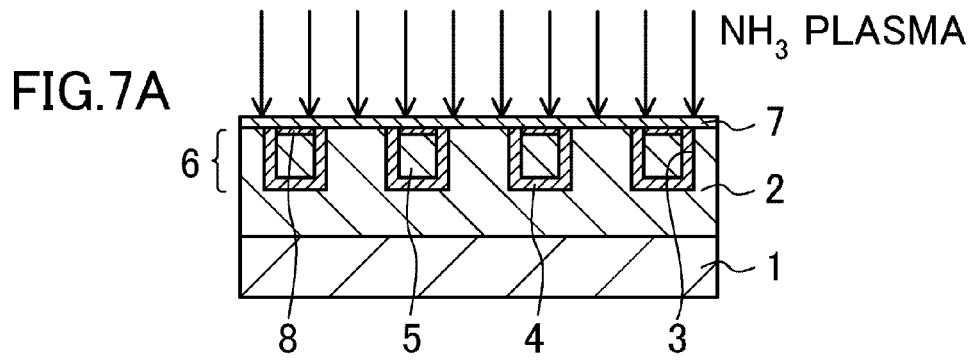
FIGS. 7A-7D are cross-sectional views illustrating a method of manufacturing a semiconductor device according to a second modified example of the first example embodiment in the order of the steps performed.

First, as shown in FIG. 7A, the surface of the protective film 7 is exposed to $NH_3$ plasma. This promotes diffusion among the first Cu film 5, the protective film 7, and the $CuSi_x$ layer 8, and improves adhesion between the first Cu film 5 and the protective film 7, and therefore, electromigration resistance can be improved compared to the first example embodiment. In order to reliably obtain this advantage, it is preferable to expose the surface of the protective film 7 to plasma generated in an atmosphere including a nitrogen compound, such as nitrogen ($N_2$), diazene (HN=NH) and hydrazine ($H_2N-NH_2$), etc. Another preferable method is to expose the surface of the protective film 7 to ultraviolet radiation.

Figure 7B:
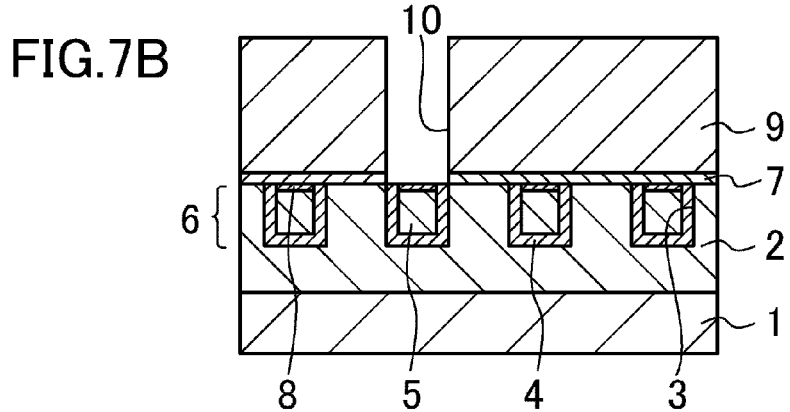
Figure 7C:
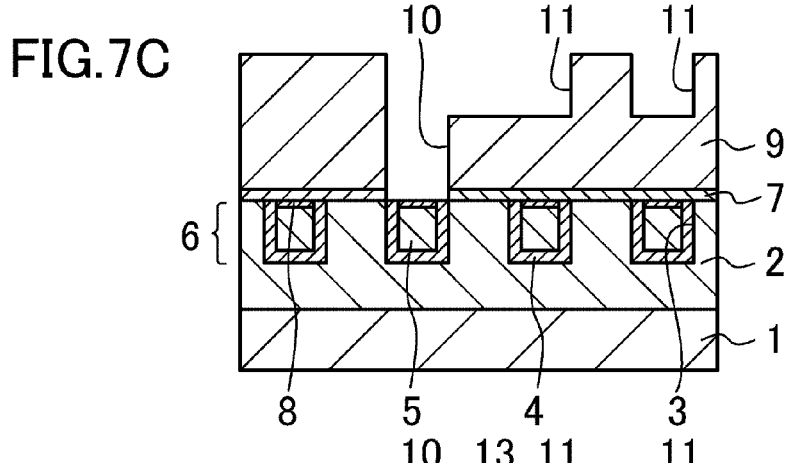
Figure 7D:
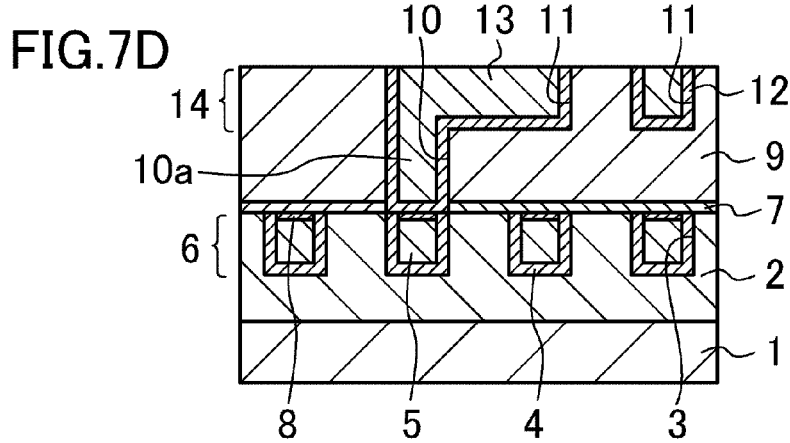

Next, as shown in FIGS. 7B-7D, as well as in the first example embodiment, after the second insulating film 9 is formed on the protective film 7, and the via hole 10 and the second interconnect groove 11 are formed in the second insulating film 9, the second barrier film 12 and the second Cu film 13 are sequentially formed so as to fill the via hole 10 and the second interconnect groove 11, thereby forming a via 10a and the upper interconnect 14. After the step shown in FIG. 7D, by repeating the steps shown in FIGS. 2C, 2D, and FIGS. 7A-7D, a semiconductor device including a desired number of layers of interconnects can be manufactured.

This embodiment is an example in which steps are added to those in the first example embodiment, and this embodiment is also applicable to the first modified example of the first example embodiment.

According to the second modified example of the first example embodiment, the $CuSi_x$ layer serving as a reaction layer can be precisely controlled, and therefore, semiconductor devices having electromigration resistance that is high enough for practical use and an operating speed that is high enough for practical use can be obtained.

(Second Example Embodiment)

A semiconductor device according to a second example embodiment will be described with reference to FIG. 8. The semiconductor device according to the second example embodiment has the structure identical with the structure of the semiconductor substrate 1—the lower interconnect 6, and the $CuSi_x$ layer 8 shown in FIG. 1 in the semiconductor device of the first example embodiment, and explanation thereof will be omitted.

Figure 8:
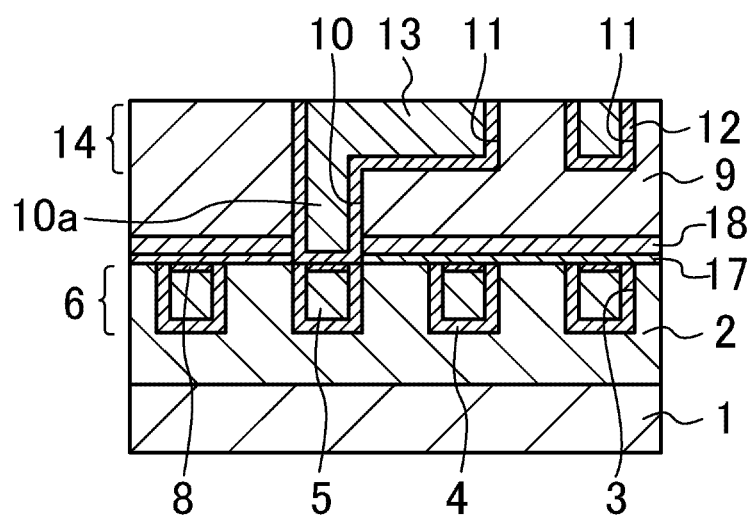
FIG. 8 is a cross-sectional view of a semiconductor device according to a second example embodiment.

As shown in FIG. 8, a protective film 17 having a thickness of approximately 5 nm which is a silicon carbonitride film (SiCN) is formed so as to cover the first insulating film 2, the first barrier film 4, and the $CuSi_x$ layer 8. A stopper film 18 having a thickness of approximately 20 nm which is an oxygen doped silicon carbide film (SiCO film) is formed on the protective film 17. A second insulating film 9 which is a SiOC film is formed on the stopper film 18. The via hole 10 which passes through the second insulating film 9, the stopper film 18, and the protective film 17, and through which the $CuSi_x$ layer 8 and the first barrier film 4 are exposed is formed on part of the $CuSi_x$ layer 8 and the first barrier film 4 formed in the vicinity thereof, and a second interconnect groove 11 is formed in the upper part of the second insulating film 9. The second barrier film 12 is formed on the via hole 10, and sidewalls and the bottom surface of the second interconnect groove 11, and a second Cu film 13 is formed on the second barrier film 12 so as to fill the via hole 10 and the second interconnect groove 11, thereby forming a via 10a and an upper interconnect 14. The via 10a connects the lower interconnect 6 and the upper interconnect 14 together.

Depending on the material of the second insulating film 9, there is a case in which excellent yield is obtained when the lower interconnect 6 is not exposed in the bottom of the via hole 10 in the formation of the via hole 10, and the lower interconnect 6 is exposed in the formation of the second interconnect groove 11. In order to stably achieve this case, the stopper film 18 whose etch selectivity ratio is larger than that of the second insulating film 9 is formed in this embodiment.

The semiconductor device according to the second example embodiment is provided with a reaction layer having a thickness necessary to reduce an increase of the resistance of the interconnect, and improve adhesion between the interconnect and films in the vicinity of the interconnect, and therefore, the semiconductor device can have electromigration resistance that is high enough for practical use and an operating speed that is high enough for practical use.

A method of manufacturing the semiconductor device according to the second example embodiment will be described hereinafter with reference to FIGS. 9A-9C, and FIGS. 10A-10C. In FIGS. 9A-9C, and FIGS. 10A-10C, the same reference characters as those shown in FIGS. 2A-2D and FIGS. 3A-3C in the first example embodiment have been used to designate elements identical with the elements shown in FIGS. 2A-2D and FIGS. 3A-3C in the first example embodiment, and explanation thereof will be omitted. In the second example embodiment, the steps of forming the semiconductor substrate 1 through the lower interconnect 6 are identical with those shown in the first example embodiment, and explanation thereof will be omitted.

Figure 9A:
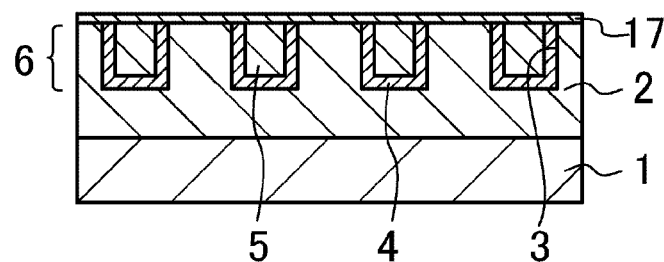
FIGS. 9A-9C are cross-sectional views illustrating a method of manufacturing the semiconductor device according to the second example embodiment in the order of the steps performed.

First, as shown in FIG. 9A, the protective film 17 having a thickness of approximately 5 nm which is a SiCN film is formed on the first insulating film 2, the first barrier film 4, and the first Cu film 5.

Figure 9B:
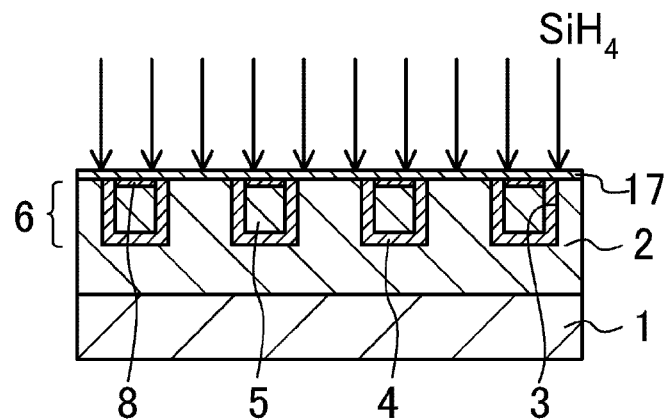

Next, as shown in FIG. 9B, the semiconductor substrate 1 is heated, and is exposed to $SiH_4$. With this step, the $CuSi_x$ layer 8 serving as a reaction layer is formed on the interface between the first Cu film 5 and the protective film 17.

Figure 9C:
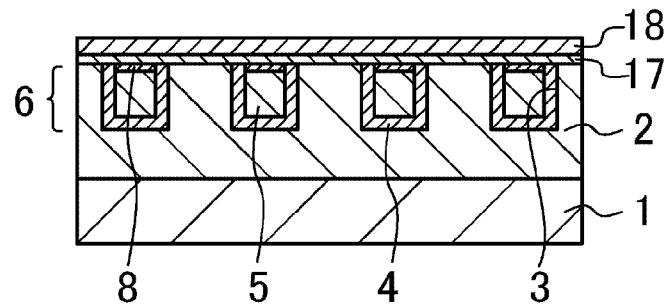
Figure 11A:
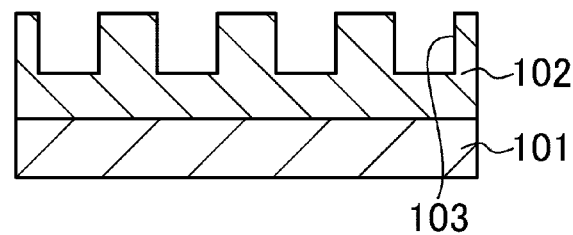
FIGS. 11A-11D are cross-sectional views illustrating a method of manufacturing a conventional semiconductor device in the order of the steps performed.
Figure 11B:
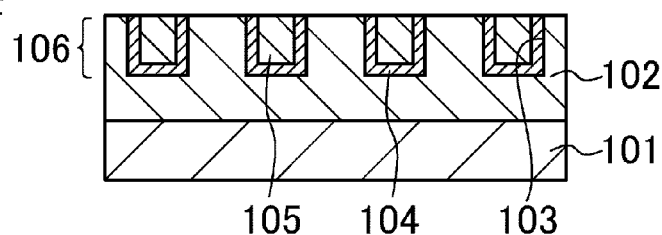
Figure 11C:
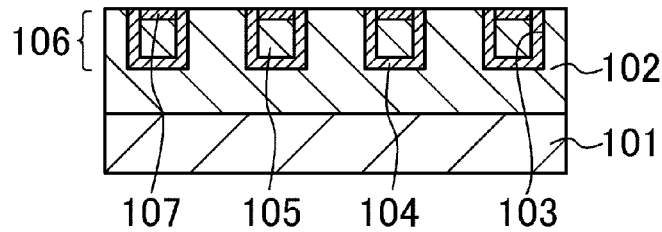
Figure 11D:
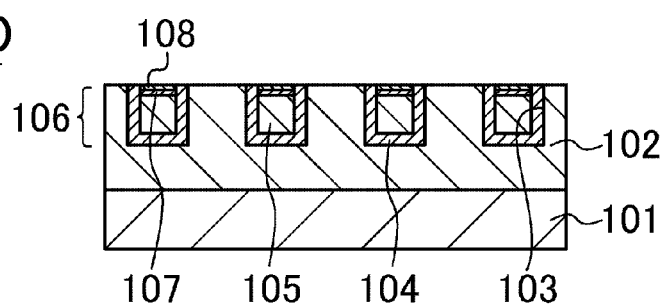
Figure 12A:
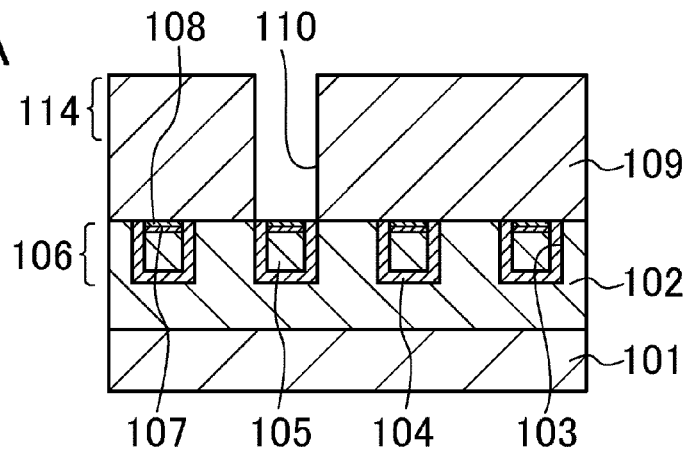
FIGS. 12A-12C are cross-sectional views illustrating the method of manufacturing the conventional semiconductor device in the order of the steps performed.
Figure 12B:
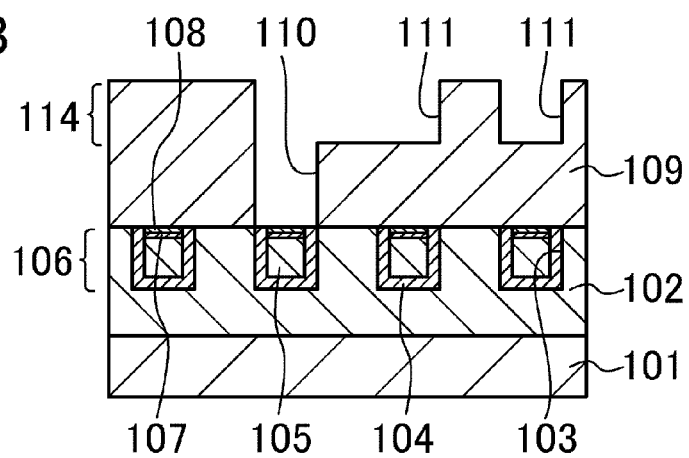
Figure 12C:
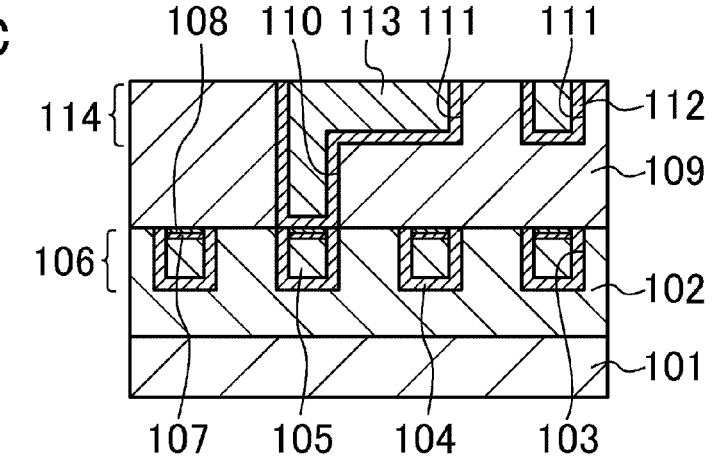

Next, as shown in FIG. 9C, the stopper film 18 is formed on the protective film 17. SiCO or silicon nitride (SiN) is preferably used as a material of the stopper film 18. The SiCO can be obtained by a plasma CVD method using tetramethylsilane (TMS) and carbon dioxide ($CO_2$) as source gas, and the SiN can be obtained by a plasma CVD method using silane and $NH_3$ as source gas. In this embodiment, a SiCO film having a thickness of approximately 20 nm is used as the stopper film 18. Next, as shown in FIG. 10A, the second insulating film 9 is formed on the stopper film 18.

Next, as shown in FIG. 10B, the via hole 10 is formed inside the on the second insulating film 9. At that time, the via hole 10 is etched under the condition that an etching rate of the stopper film 18 is less than that of the second insulating film 9, and the etching is stopped on the surface of the stopper film 18.

Depending on the material of the second insulating film 9, there is a case in which excellent yield is obtained when the lower interconnect 6 is not exposed in the bottom of the via hole 10 in the formation of the via hole 10, and the lower interconnect 6 is exposed in the formation of the second interconnect groove 11. In order to stably achieve this case, it is useful to form the stopper film 18 whose etch selectivity ratio is larger than that of the second insulating film 9, and perform etching for the formation of the via hole 10 until the stopper film 18 is exposed.

Next, as shown in FIG. 10C, after the second interconnect groove 11 is formed in the upper part of the second insulating film 9, and the protective film 17 and the stopper film 18 in the bottom portion of the via hole 10 are removed, the second barrier film 12 and the second Cu film 13 are sequentially formed so as to fill the via hole 10 and the second interconnect groove 11, thereby forming a via 10a and the upper interconnect 14. After the step shown in FIG. 10C, by repeating the steps shown in FIGS. 9A-9C and FIGS. 10A-10C, a semiconductor device including a desired number of layers of interconnects can be manufactured.

This embodiment is an example in which the step of forming the stopper film 18 is added to those in the first example embodiment, and this embodiment is also applicable to the first and second modified examples of the first example embodiment.

According to the method of manufacturing the semiconductor device in the second example embodiment, the $CuSi_x$ layer serving as a reaction layer can be precisely controlled, and therefore, semiconductor devices having electromigration resistance that is high enough for practical use and an operating speed that is high enough for practical use can be obtained.

In view of the foregoing, the example embodiments and the modified examples of the embodiment are described as stated above, and the present invention is not limited to these embodiments and modified examples.

For example, in the above example embodiments, $SiH_4$ is used for the formation of the $CuSi_x$ layer 8 and the reaction layer 16. Instead of $SiH_4$, a silicon compound, such as polysilane ($Si_nH_{2n+2}$), etc., can be used for the formation. Instead of the silicon compound, a germanium compound, such as germane ($GeH_4$) and polygermane ($Ge_nH_{2n+2}$), etc., can be used for the formation. In this case, a copper germanide ($CuGe_x$) layer is formed instead of the $CuSi_x$ layer, and the reaction layer 16 is a mixture of $YGe_x$ and $CuGe_x$. Y refers to any of Ni or Co.

Although, in the above example embodiments, the surface of the protective film 7 is exposed to reactive gas, such as $SiH_4$, for the formation of the $CuSi_x$ layer 8 or the reaction layer 16, additional means for chemically or physically activating the reactive gas may be utilized. A former example includes formation of radicals or ionization of the reactive gas by plasma in the inside or the outside of a reaction device. A latter example includes imparting kinetic energy to the reactive gas by application of an ion implantation technique.

In the above example embodiments, the lower interconnect 6 is used by using the first Cu film 5. The lower interconnect 6 can be formed by using a Cu alloy film, an aluminum (Al) film, an Al alloy film, a silver (Ag) film, an Ag alloy film, a gold (Au) film, and an Au alloy film, etc. In these cases, the $XSi_x$ layer is formed instead of the formation of the $CuSi_x$ layer, and the reaction layer 16 is a mixture of $YGe_x$ and $CuGe_x$. X is a main element of the lower interconnect, and Y refers to any of Ni or Co.

In the above example embodiments, the via hole 10 is formed prior to the formation of the second interconnect groove 11. Conversely, it is possible to form the second interconnect groove 11 prior to the formation of the via hole 10.

The present invention is applicable in various forms of modifications without departing from the spirit and scope of the present invention.

As stated above, the semiconductor device and the method of manufacturing the same according to the present disclosure can precisely control the thickness of a reaction layer, and the semiconductor device can have electromigration resistance that is high enough for practical use and an operating speed that is high enough for practical use, and in particular, the present disclosure is useful for semiconductor devices having a buried interconnect structure and methods of manufacturing such semiconductor devices.

What is claimed is:

1. A method of manufacturing a semiconductor device, the method comprising the steps of:
   (a) forming a first insulating film on a semiconductor substrate;
   (b) forming an interconnect groove in the first insulating film;
   (c) forming a first interconnect in the interconnect groove;
   (d) forming a protective film on the first insulating film and the first interconnect; and
   after the step (d), (e) exposing a surface of the protective film to reactive gas, thereby forming a reaction layer on an interface between the first interconnect and the protective film.

2. The method of claim 1, wherein
the step (e) is performed by exposing the surface of the protective film to a silicon compound or a germanium compound.

3. The method of claim 1, wherein
the step (e) includes a sub-step of chemically activating the reactive gas.

4. The method of claim 1, wherein
the step (e) includes a sub-step of chemically activating the reactive gas by ionizing the reactive gas.

5. The method of claim 1, wherein
the step (e) includes a sub-step of physically activating the reactive gas.

6. The method of claim 1, wherein
the step (e) includes a sub-step of physically activating the reactive gas by imparting kinetic energy to the reactive gas.

7. The method of claim 1, further comprising the steps of:
(f) forming a second insulating film on the protective film;
(g) forming a via hole inside the second insulating film; and
(h) filling the via hole with a metal material to form a via, and forming a second interconnect so that the second interconnect is connected to the via.

8. The method of claim 1, wherein
the protective film is a silicon carbonitride film.

9. The method of claim 1, further comprising the step of
(c1) forming a cover layer in the upper part of the first interconnect after the step (c) and before the step (d).

10. The method of claim 9, wherein
a main material of the cover layer is nickel, nickel alloy, cobalt, or cobalt alloy.

11. The method of claim 1, further comprising the step of
(e1) exposing the surface of the protective film to plasma after the step (e).

12. The method of claim 11, wherein
the plasma is generated in an atmosphere including a nitrogen compound.

13. The method of claim 1, further comprising the step of
(e2) exposing the surface of the protective film to ultraviolet radiation after the step (e).

14. The method of claim 1, further comprising the step of
(e3) forming a stopper film on the protective film after the step (e).

15. The method of claim 14, wherein
the stopper film is an oxygen doped silicon carbide film or a silicon nitride film.

16. The method of claim 1, wherein
the reaction layer is a silicon compound layer or a germanium compound layer.

17. The method of claim 1, wherein
a main material of the first interconnect is aluminum, aluminum alloy, copper, copper alloy, silver, silver alloy, gold, or gold alloy.

18. A method of manufacturing a semiconductor device, the method comprising the steps of:
   forming a first insulating film on a semiconductor substrate;
   forming an interconnect groove in the first insulating film;
   forming a first interconnect in the interconnect groove; and
   forming a reaction layer in an upper part of the first interconnect, wherein
   the reaction layer is formed under a condition where a supply rate controls a reaction.

19. The method of claim 18, wherein
the reaction layer is a silicon compound layer or a germanium compound layer.

* * * * *